United States Patent [19]

Traskos

[11] 3,899,332

[45] Aug. 12, 1975

[54] PRINTING PLATE AND METHOD OF MAKING THE SAME

[75] Inventor: Richard T. Traskos, Brooklyn, Conn.

[73] Assignee: Lith-Kem Corporation, Lynbrook, N.Y.

[22] Filed: June 12, 1974

[21] Appl. No.: 478,639

Related U.S. Application Data

[62] Division of Ser. No. 288,043, Sept. 11, 1972, Pat. No. 3,837,858.

[52] U.S. Cl. ............................ 96/33; 96/49; 96/75; 96/91 R; 96/68; 101/456; 101/457

[51] Int. Cl.²........................ G03F 7/02; G03C 1/52

[58] Field of Search ........... 96/49, 75, 91 R, 33, 68; 101/456, 457

[56] References Cited

UNITED STATES PATENTS

| | | | |
|---|---|---|---|
| 2,649,373 | 8/1953 | Neugebauer et al. | 96/75 |
| 2,937,085 | 5/1960 | Seven et al. | 96/91 R |
| 3,294,533 | 12/1966 | Sus et al. | 96/75 |
| 3,353,984 | 11/1967 | Landau | 96/75 |
| 3,479,182 | 11/1969 | Chu | 96/75 |
| 3,484,241 | 12/1969 | Euleth et al. | 96/75 |
| 3,522,042 | 7/1970 | Borchers et al. | 96/75 |
| 3,554,751 | 1/1971 | Thomas | 96/91 R |
| 3,615,532 | 10/1971 | Silver | 96/75 |

*Primary Examiner*—Norman G. Torchin
*Assistant Examiner*—Edward C. Kimlin

[57] ABSTRACT

An aqueous developable subtractive printing plate is presented comprising a photosensitized hydrophilic surface having a photosensitive diazo-borofluoride salt thereon.

A method for making a photosensitized printing plate is also presented wherein a photosensitive diazo-borofluoride salt is coated on the plate.

37 Claims, No Drawings

PRINTING PLATE AND METHOD OF MAKING THE SAME

This is a division of application Ser. No. 288,043, filed Sept. 11, 1972, now U.S. Pat. No. 3,837,858.

BACKGROUND OF THE INVENTION

The present invention relates to photosensitive planographic printing plates and to a method for their preparation. More particularly, this invention relates to an aqueous developable subtractive printing plate and the method of manufacture thereof.

Photosensitive planographic printing plates are generally of two types. One type is the so-called additive type. This form of printing plate requires the application of an oleophilic protective coating or lacquer to the image on the plate after exposure and during or after development thereof in order for the image area of the plate to be able to accept ink and otherwise perform satisfactorily on a lithographic printing press.

The other type of printing plate is the so-called subtractive printing plate; i.e., plates whose developer removes photosensitive material from the non-image areas but adds nothing to the image areas. These image areas already have a sufficient oleophilicity to accept ink and otherwise perform satisfactorily on the lithographic press.

In connection with the additive type of plate the protective coating is usually applied to the plates using a so-called lacquer developer which generally comprises a two-phased oil in water emulsion in which the polymeric coating materials are dissolved in the oil phases. Proper development of any additive plate with a lacquer developer requires a considerable amount of skill in order to obtain a uniform coating of the lacquer on the image. The additive type printing plates are especially difficult to process where the images comprise large solid areas. type image reverses and fine screen areas. The development of the subtractive type plates requires less skill due to the fact that nothing need be done or added to the image area.

Although more advantageous than the additive type of plates, there are also several disadvantages associated with conventional prior art subtractive type plates. Most commercially available subtractive lithographic printing plates and their developers are unsatisfactory from safety and ecological standpoints. Such developers usually contain toxic organic constituents and/or harsh alkaline or acidic ingredients. Also, the plates themselves often are made with a thick coating which is not soluble in the developer or in tap water and hence, once pushed off the non-image areas of the plate by the developers, collects in and plugs drains as a rubbery-like sludge. Moreover, the organic constituents of the developers are only slowly biodegradable while others have high biological and chemical oxygen demands thereby being highly disadvantageous from an ecological standpoint.

SUMMARY OF THE INVENTION

According to the invention, there is provided a photosensitive, subtractive negative-working printing plate comprising a hydrophilic substrate coated with a diazoresin photosensitizer and in intimate contact therewith a layer containing a photosensitive, solvent soluble, diazo-borofluoride salt. The plate of the invention is subtractive and can be developed by a developer which is water or an aqueous solution in which the ingredients other than water are harmless and/or easily biodegradable or are present in extremely small quantities.

The preferred form of the invention having the above advantages is a presensitized lithographic printing plate having a stabilized water soluble diazo resin system in intimate contact with a layer which is predominantly a photosensitive solvent soluble diazo-borofluoride salt.

The invention also comprises a method for making the above plates.

The invention also comprises a method which can be used to convert normally additive printing plates based on water soluble diazo resins to subtractive plates by coating the photosensitive surface with a layer which is predominantly photosensitive solvent soluble diazo-borofluoride salt, the resulting plate having the development advantages mentioned above.

Accordingly, one object of the present invention is to provide novel and improved subtractive-type photosensitive printing plates, the processing and development of which are not subject to the disadvantages associated with those of the prior art.

Another object of the invention is to provide a novel and improved method for manufacturing the above plates.

Still another object of the present invention is to provide a novel and improved printing plate and method of manufacture thereof wherein a normally additive printing plate having a water soluble diazo resin sensitizer is converted to a subtractive plate free of many of the problems of prior art subtractive plates.

Other objects and advantages will be apparent to and understood by those skilled in the art from the following detailed description.

DETAILED DESCRIPTION OF THE INVENTION

The planographic printing plates of the present invention comprise suitable, self-supporting substrates having a printing surface comprising a hydrophilic material photosensitized with a first layer of a water soluble diazo resin coating reactive to light and capable of being developed to define hydrophobic, oleophilic printing and hydrophilic, oleophobic nonprinting areas wherein the printing surface also contains in intimate contact with the diazo resin a second layer of a photosensitive, solvent soluble diazo-borofluoride salt over the first water soluble diazo resin layer.

The method of the invention comprises treating a planographic printing plate having a printing surface comprising a hydrophilic material photosensitized with a first layer of a water soluble diazo resin coating reactive to light to define hydrophobic, oleophilic printing and hydrophilic, oleophobic nonprinting areas in the printing surface by coating the diazo resin surface with a second layer of a photosensitive, solvent soluble diazo-borofluoride salt, which treatment renders the printing plate susceptible to subtractive development.

The water soluble diazo resin and the solvent soluble diazoborofluoride must be present in two layers with the coating of the diazo-borofluoride being on top of the diazo resin. The diazo-borofluoride salt may also aid in stabilizing the diazo resin, i.e. improve its self life, as well as contributing to the subtractive nature of the plate.

The substrates which may be employed as printing plate bases are well-known in the art. Generally, these comprise self-supporting substrates the uppermost surface of which is hydrophilic. Suitable materials include passivated metals or suitably coated paper or plastic substrates. It is to be understood that no criticality is attached to the particular substrate employed and that any of those conventionally employed in the art may be utilized.

The hydrophilic substrate is generally coated with a photosensitive diazo resin which is reactive image-wise to light to define, upon development, hydrophobic, oleophilic, ink-receptive, printing areas and hydrophilic, oleophobic, nonprinting areas in the printing surface.

Light sensitive diazo resins for photosensitizing printing plates, such as aldehyde condensation products of a p-diazo diphenyl amine stabilized with metal salts are well-known in the art. Such resins are also available commercially. e.g. Diazo Resin No. 4 supplied by Fairmount Chemical Company. This material is described as a diazonium sulphate-zinc chloride double salt. Early patents covering diazo resins include U.S. Pat. No. 2,063,631 and U.S. Pat. No. 2,679,498. It is to be understood that any of the diazo resins disclosed therein and/or used in the art may be utilized according to the present invention to form the diazo resin layer or coating.

Methods for sensitizing printing plates with diazo resins are well-known in the prior art as evidenced by the disclosures of above noted patents and U.S. Pat. No. 2,714,066. Generally, the plates are coated with a water or water-alcohol solution of the diazo resin to provide a sensitized plate. Generally, a coating of from about 10 mg/sq. meter to about 500 mg/sq. meter of the resin is provided on the plate. The photosensitizer may be applied from any suitable solvent solution employing any of the conventional coating means.

Especially suitable for use as the sensitized plate according to the present invention are the photosensitive printing plates stabilized in accordance with the invention described in my copending application Ser. No. 288,053, filed concurrently herewith. Briefly, the invention described therein comprises stabilizing diazo resin photosensitized planographic printing plates with complexes of metal salts and diazo salts. The disclosure of said application is also incorporated herein by reference. In the use of such plates in this invention a coating of solvent soluble diazo-borofluoride salt is applied to a plate coated with a photosensitizable diazo resin stabilized with a complex of metal salt and diazo salt.

Suitable diazo-borofluoride salts for use according to the present invention include the photosensitive, solvent soluble diazo-borofluoride salts. The preferred salts are p-diazo-2,5-di(lower alkoxy)-1-(p-tolylmercapto) benzene borofluorides. The most preferred salt is p-diazo-2,5-diethoxy-1-(p-tolylmercapto) benzene borofluoride.

In order to achieve the objects of the invention, it is necessary that the diazo-borofluoride salts be in intimate contact with the diazo resin. This is achieved by coating the precoated diazo resin plate with the borofluoride salt.

The preferred method of coating the precoated diazo resin plate is with a solution of the borofluoride salt. Any of several solvents for the salt may be employed. The only criticality connected with the solvent is that it must be a non-solvent for the diazo resin and other ingredients of the photosensitive coating. Suitable solvents include, but are not limited to, methyl ethyl ketone, cyclohexanone, diacetone alcohol, 2-nitropropane, and methyl cellosolve.

Any of the conventional coating methods may be employed to coat the borofluoride-diazo salt on the photosensitive surface.

The printing plates of the invention are of the subtractive type and can be developed with water or with aqueous solutions in which the ingredients other than water are harmless and/or easily biodegradable or are present in extremely small quantities. The developed image accepts ink readily. The background is hydrophilic and oleophobic. It appears that the water passes through the upper coating of diazo-borofluoride salt to dissolve the unexposed diazo resin and wash away both the unexposed resin of the lower layer and the diazo-borofluoride salt above the unexposed resin. The diazo-borofluoride coating in the areas above the exposed diazo resin areas which have become insoluble upon exposure remains as a coating on the exposed areas.

Generally the developers should have a pH value below 9 for speedy development. Generally, the higher the pH above 9 the slower the development. If the pH value is too low the substrate may be attacked. Where a metal substrate is employed, a gum-type additive may be incorporated in acidic developer solutions to prevent attack thereon.

After development the plate may be finished by applying gum arabic, or any well known gum substitute, in accordance with standard finishing practices.

Suitable aqueous developer solutions are as follows:

A. Water
B. 11% gum arabic and 4.5% phosphoric acid (with and without 10% methyl cellosolve)
C. 5.5% gum arabic and 2.8% phosphoric acid
D. 2% arabogalactan gum and 2% citric acid
E. 2% arabogalactan gum and 5% citric acid
F. 2% arabogalactan gum and 10% citric acid
G. 2% gum arabic and 2% citric acid
H. 2% citric acid
I. 2% phosphoric acid
J. 2% sodium acetate It has also been determined that the incorporation of a minor amount (30% or less by weight, 20–30% being very effective) of an organophilic, hydrophobic water insoluble organic resin in the upper coating of diazo-borofluoride will contribute to a substantial lengthening in running life of the plate. Such resins include polyvinylacetate (e.g. "AYAT" Union Carbide Co.), polyvinyl chloride-polyvinylacetate copolymers (e.g. Union Carbide's VYLL, VYSH, and VMCH) and styrene-butadiene copolymers.

It has also been determined that a particularly effective coating configuration is about 20 mg/ft$^2$ of total coating of both the lower diazo resin and the upper diazo-borofluoride salt, divided about 10 mg/ft$^2$ of each. Coating weight can, in some situations be as low as about 1.5 mg/ft$^2$ for each layer (i.e. a total of 3 mg/ft$^2$). Conversely, weights of up to 15 mg/ft$^2$ for each layer have also been determined to be effective, and higher weights may be effective. The concentrations of materials used in solutions for forming the coatings will vary depending on the desired coating weight and the particular coating process used.

In the following examples, percentages will be weight percentages unless otherwise indicated.

EXAMPLE 1

An electrochemically grained, specially anodized, unsealed aluminum was coated first with a solution containing:

1.5% (by weight) of the condensation product of p-diazodiphenylamine sulfate with formaldehyde (e.g. Fairmount Chemicals' Diazo Resin No. 4).

1.5% (by weight) p-diazo-N,N-diethylaniline-zinc chloride complex (e.g. Fairmount Chemicals' DE-40) in a 4/1 (by volume) mixture of water/n-propanol.

The coated aluminum, either sheet or coil, was dried and then was coated with a second solution which contained:

3.0% (by weight) p-diazo-2,5-diethoxy-1-(p-tolylmercapto) benzene borofluoride (e.g. Sobin Chemicals' DET.BF4) in methyl ethyl ketone.

The coated aluminum was again dried.

Printing plates cut from this aluminum are believed stable in the dark for greater than 6 months, and when freshly prepared passed an accelerated heat age test of 24 hours at 70°C (and low relative humidity) without difficulty). Tests show that unexposed plates which pass a heat age test of 21 hours at 70°C and low R.H. are stable for greater than 6 months under normal room temperature conditions. Passing this test means that the unexposed plate is subjected to the high temperature and then is prepared for and run on press without difficulty, i.e. the plate develops easily, does not give a toning problem or scumming problem on press, and the image prints normally).

To prepare the plate for press, the plate was exposed to an ultraviolet-rich light source through a photographic negative. The plate thus exposed had a visible image area.

A plate prepared in the above manner developed easily with either of the following developers:

A. Water with 11% gum arabic, 4.5% phosphoric acid and 10% methyl cellosolve, or B. Water with 1% sulfuric acid and 10% diacetone alcohol.

The developer removes the unwanted photosensitive materials from the non-printing areas leaving in the image areas the tough, oleophilic, ink-receptive, water insoluble coating which has formed by photoinitiated reactions caused by the exposure to UV light.

The plate was then rinsed with water to rinse away the developer and the unwanted photosensitive materials (alternatively, the developer and the unwanted photosensitizers can be wiped off the plate using a dry cloth). The plate was then finished with a solution of gum arabic (or with one of the gum-type substitutes) — such finishing is standard practice on aluminum-based printing plate in the lithographic industry.

The plate thus prepared, i.e. developed with either of the developers noted, rolled up (i.e. accepted ink) quickly on a lithographic printing press, and ran in excess of 40,000 high-quality printing impressions without difficulty.

EXAMPLE 2

A mechanically roughened (by wire brushes) aluminum sheet or plate was provided with a silicate film on at least one surface by means of reaction of said surface with an aqueous alkali metal silicate solution, and then washed free of residual alkali. The aqueous metal silicate solution was a suspension of powdered sodium silicate having a ratio of $SiO_2$:$Na_2O$ of 1:3.28 in 42° Baume sodium silicate solution having a ratio of $SiO_2$:$Na_2O$ of 1:3.25.

The dried silicated aluminum sheet was coated first with a solution containing:

1.5% Diazo Resin No. 4 (See Example 1.)

0.75% p-diazo-2,5-diethoxy-1-(p-tolylmercapto) benzene zinc chloride 0.375% p-diazo-N,N-diethylaniline zinc chloride 0.13% Acid Fuchsin (C.I. No. 42685)

in 2/1 water/n-propanol.

The coated aluminum, either sheet or coil, was dried and was then coated with a solution of 4.0% DET.BF4 (See Example 1.) and 0.2% Victoria Pure Blue B.O. (Available from E.I. duPont de Nemours & Company)

in 2-nitropropane.

The coated aluminum was again dried. Printing plates cut from this coated aluminum pass a 21-hour at 70°C heat acceleration test, and therefore (as discussed in Example 1) are believed stable for 6 months in a dark place.

To prepare the plate for press, the plate was exposed to an ultraviolet-rich light source through a photographic negative. The plate thus exposed had a visible image area.

A plate prepared in the above manner developed easily with a solution of 3.9% gum arabic and 0.25% sulfuric acid in water.

The developer removes the unwanted photosensitive materials from the non-printing areas leaving in the image areas the tough, oleophilic, ink-receptive, water insoluble coating which has formed by photoinitiated reactions caused by the exposure to UV light. The plate after development and finishing has a strong visible image.

The plate was then rinsed with water to rinse away the developer and the unwanted photosensitive materials (alternatively, the developer and the unwanted photosensitizers can be wiped off the plate using a dry cloth). The plate was then finished with a solution of gum arabic (or with one of the gum-type substitutes) — such finishing is standard practice on aluminum-based printing plates in the lithographic industry.

The plate exposed, developed and finished rolled up quickly and printed many high-quality impressions.

EXAMPLE 3

An electrochemically grained, specially anodized, unsealed aluminum was coated first with a solution containing:

1.0% Diazo Resin No. 4 (See Example 1.) 1.75% p-diazo-N,N-diethyl-m-phenetidine zinc chloride in 2/1 water/n-propanol.

The coated aluminum, either sheet or coil was dried and was then coated with a second solution which contains:

3.5% DET.BF4 (See Example 1.) in methyl ethyl ketone

A printing plate cut from this coated aluminum was exposed to an ultraviolet-rich light source through a photographic negative. The plate thus exposed had a visible image area.

A plate prepared in the above manner developed easily with the following developer:

Water with 11% gum arabic, 4.5% phosphoric acid and

10% methyl cellosolve.

The developer removed the unwanted photosensitive materials from the non-printing areas leaving in the image areas the tough, oleophilic, ink-receptive, water-insoluble coating formed by photoinitiated reactions caused by the exposure to UV light.

The plate was then rinsed with water to rinse away the developer and the unwanted photosensitive materials (alternatively, the developer and the unwanted photosensitizers can be wiped off the plate using a dry cloth). The plate was then finished with a solution of gum arabic (or with one of the gum-type substitutes) — such finishing is standard practice on aluminum-based printing plates in the lithographic industry.

The plate thus prepared, rolled up (i.e. accepted ink) quickly on a lithographic printing press, and was determined to be capable of many high-quality printing impressions without difficulty.

EXAMPLE 4

An electrochemically grained, specially anodized, unsealed aluminum was coated first with a solution containing:

2.0% Diazo Resin No. 4 (See Example 1.)

1.0% p-diazo-N,N-diethylaniline zinc chloride with either 0.2% Victoria Pure Blue B.O. or 0.2% Ethyl Red in 72/28 water/n-propanol.

The coated aluminum was dried and was then coated with a second solution which contains:

4.0% DET.BF4 (See Example 1.) with 0.2% Victoria Pure Blue B.O. or Ethyl Red in 2-nitropropane.

To prepare the plate for press, the plate was exposed to an untraviolet-rich light source through a photographic negative. The plate thus exposed had a visible image area.

A printing plate prepared in the above manner developed easily with the following developer:

Water with 11% gum arabic and 0.69% sulfuric acid.

The developer removed the unwanted photosensitive materials from the non-printing areas leaving in the image areas the tough, oleophilic, ink-receptive, water-insoluble coating formed by photoinitiated reactions caused by the exposure to UV light.

The plate was then rinsed with water to rinse away the developer and the unwanted photosensitive materials (alternatively, the developer and the unwanted photosensitizers can be wiped off the plate using a dry cloth). The plate was then finished with a solution of gum arabic (or with one of the gum-type substitutes) — such finishing is standard practice on aluminum-based printing plates in the lithographic industry.

The plate thus prepared rolled up (i.e. accepted ink) quickly on a lithographic printing press, and was determined to be capable of many high-quality printing impressions without difficulty.

EXAMPLE 5

An electrochemically grained, specially anodized, unsealed aluminum was coated first with a solution containing:

2.0% Diazo Resin No. 4 (See Example 1.)

2.0% p-diazo-N,N-diethylaniline zinc chloride in 75/25 water/n-propanol.

The coated aluminum was dried and was then coated with a second solution which contains:

4.0% DET.BF4 (See Example 1.)

1.0% polyvinylacetate (e.g. Union Carbide's AYAT)

0.2% Victoria Pure Blue B.O.

in 2-nitropropane.

To prepare the plate for press, the plate was exposed to an ultraviolet-rich light source through a photographic negative. The plate thus exposed had a visible image area.

A printing plate prepared in the above manner developed easily with either of the following developers:

A. Water

B. Water with 3.9% gum arabic and 0.25% sulfuric acid, or

C. Water with 2% sodium acetate

The developer removed the unwanted photosensitive materials from the non-printing areas leaving in the image areas the tough, oleophilic, ink-receptive, water-insoluble coating formed by photoinitiated reactions caused by the exposure to UV light.

The plate was then rinsed with water to rinse away the developer and the unwanted photosensitive materials (alternatively, the developer and the unwanted photosensitizers can be wiped off the plate using a dry cloth). The plate was then finished with a solution of gum arabic, (or with one of the gum type substitutes) — such finishing is standard practice on aluminum-based printing plates in the lithographic industry.

A plate thus prepared and developed with developer B, rolled up (i.e. accepted ink) quickly on a lithographic printing press, and ran in excessof 65,000 high-quality printing impressions without difficulty. This plate also passed an accelerated heat age test of 21 hours at 70°C and at low relative humidity.

EXAMPLE 6

An electrochemically grained, specially anodized, unsealed aluminum was coated first with a solution containing:

1.5% Diazo Resin No. 4 (See Example 1.)

0.75% p-diazo-N,N-diethylaniline zinc chloride 0.2% Acid Fuchsin in 72/28 water/n-propanol.

The coated aluminum, either sheet or coil, was dried and was then coated with a second solution which contains:

4-p-diazo-2,5-diethoxy-1-morpholinobenzene borofluoride in 2-nitropropane.

To prepare the plate for press, the plate was exposed to the ultraviolet-rich light source through a photographic negative. The plate thus exposed had a visible image area.

A printing plate prepared in the above manner developed easily with the following developer:

Water with 11% gum arabic and 5.6% citric acid

The developer removed the unwanted photosensitive materials from the non-printing area leaving in the image areas the tough, oleophilic, ink-receptive, water insoluble coating formed by photoinitiated reactions caused by the exposure to UV light.

The plate was then rinsed with water to rinse away the developer and the unwanted photosensitive materials (alternatively, the developer and the unwanted photosensitizers can be wiped off the plate using a dry cloth). The plate was then finished with a solution of gum arabic (or with one of the gum-type substitutes) — such finishing is standard practice on aluminum-based printing plates in the lithographic industry.

A plate thus prepared rolled up (i.e. accepted ink) quickly on a lithographic printing press, and was determined to be capable of many high-quality printing impressions without difficulty.

What is claimed is:

1. A method of treating a planographic printing plate having a hydrophilic substrate and a first coating containing a water soluble light reactive diazo resin on said substrate, including the step of:
applying a second coating containing a photosensitive solvent-soluble diazo-borofluoride salt over and in intimate contact with said first coating;
said plate being developable by water or aqueous solution whereby areas of the first and second coatings unexposed to light are washed away to define hydrophilic oleophobic nonprinting areas, and areas of the first and second coatings exposed to light define hydrophobic oleophilic printing areas.

2. The method of claim 1 wherein said step of applying a second coating containing diazo-borofluoride salt includes:
applying a coating in which diazo-borofluoride is the principal constituent.

3. The method as in claim 1 wherein said diazo resin of said first coating includes:
a stabilized diazo resin.

4. The method as in claim 3 wherein said stabilized diazo resin includes:
a diazo resin stabilized with a complex of zinc chloride and a photosensitive diazo salt.

5. The method of claim 1 wherein said diazo resin of said first coating includes:
a condensation product of a diazo salt and an aldehyde.

6. The method of claim 1 wherein said step of applying said second coating containing a diazo-borofluoride includes:
applying a coating containing p-diazo-2,5-di(lower alkoxy-1-(p-tolylmercapto)benzene borofluoride.

7. The method of claim 1 wherein said step of applying said second coating containing a diazo-borofluoride includes:
applying a coating containing p-diazo-2,5-diethoxy-1(p-tolylmercapto)benzene borofluoride.

8. The method of claim 1 wherein:
said diazo resin is water soluble.

9. The method of claim 1 wherein said step of applying said second coating containing a diazo-borofluoride salt includes:
applying a coating having a minor amount of an organophilic hydrophobic water insoluble organic resin.

10. The method of claim 9 wherein:
said resin is polyvinylacetate.

11. The method of claim 9 wherein:
said minor amount is not more than 30% by weight.

12. The method of claim 1 wherein:
the solvent in said second coating is a non-solvent for the diazo resin.

13. The method as in claim 1 including the steps of:
exposing selected areas of said plate to selected light to react said first and second coatings in said selected areas to define hydrophobic oleophilic printing areas; and
developing said plate with water or aqueous solution to wash away areas of said first and second coatings unexposed to light to define hydrophilic oleophobic non-printing areas.

14. A method of forming a subtractive planographic printing plate including the steps of:
applying a first coating containing a water or aqueous soluble light reactive diazo resin to a hydrophilic substrate; and
applying a second coating containing a photosensitive solvent-soluble diazo-borofluoride salt over and in intimate contact with said first coating;
said plate being developable by water or aqueous solution whereby areas of the first and second coatings unexposed to light are washed away to define hydrophilic oleophobic nonprinting areas, and areas of the first and second coatings exposed to light define hydrophobic oleophilic printing areas.

15. The method of claim 14 wherein said step of applying a second coating includes:
applying a coating in which diazo-borofluoride is the principal constituent.

16. The method as in claim 14 wherein said step of applying a first coating containing a diazo resin includes:
applying a coating containing a stabilized diazo resin.

17. The method as in claim 16 wherein said stabilized diazo resin includes:
a coating of diazo resin stabilized with a complex of zinc chloride and a photosensitive diazo salt.

18. The method of claim 14 wherein said step of applying a first coating containing a diazo resin includes:
applying a coating containing a condensation product of a diazo salt and an aldehyde.

19. The method of claim 14 wherein said step of applying a coating of diazo-borofluoride includes:
applying a coating of p-diazo-2,5-di(lower alkoxy-1-(p-tolylmercapto)benzene borofluoride.

20. The method of claim 14 wherein said step of applying a coating of diazo-borofluoride includes:
applying a coating of p-diazo-2,5-diethoxy-1-(p-tolylmercapto) benzene borofluoride.

21. The method of claim 14 wherein said step of applying a first coating includes:
applying a coating containing a water soluble diazo resin.

22. The method of claim 14 wherein said step of applying a diazo-borofluoride salt includes:
applying a coating having a minor amount of an organophilic hydrophobic water insoluble organic resin.

23. The method of claim 22 wherein:
said resin is polyvinylacetate.

24. The method of claim 22 wherein:
said minor amount is not more than 30% by weight.

25. The method of claim 14 wherein the step of applying a second coating includes:
applying a coating of a diazo-borofluoride salt in a solvent solution, the solvent being a non-solvent for the diazo resin.

26. A method of forming a subtractive planographic printing plate including the steps of:
applying a first coating containing a water or aqueous soluble light reactive diazo resin to a hydrophilic substrate;

applying a second coating containing a photosensitive solvent soluble diazo-borofluoride salt over and in intimate contact with said first coating;

exposing selected areas of said plate to selected light to react said first and second coatings in said selected areas to define hydrophobic oleophilic printing areas; and developing said plate with water or aqueous solution to wash away areas of said first and second coatings unexposed to light to define hydrophilic oleophobic non-printing areas.

27. The method of claim 26 wherein said step of applying a second coating includes:

applying a coating in which diazo-borofluoride is the principal constituent.

28. The method as in claim 26 wherein said step of applying a first coating containing a diazo resin includes:

applying a coating containing a stabilized diazo resin.

29. The method as in claim 28 wherein said stabilized diazo resin includes:

a coating of diazo resin stabilized with a complex of zinc chloride and a photosensitive diazo salt.

30. The method of claim 26 wherein said step of applying a first coating containing a diazo resin includes:

applying a coating containing a condensation product of a diazo salt and an aldehyde.

31. The method of claim 26 wherein said step of applying a coating of diazo-borofluoride includes:

applying a coating of p-diazo-2,5-di(lower alkoxy-1-(p-tolylmercapto)benzene borofluoride.

32. The method of claim 26 wherein said step of applying a coating of diazo-borofluoride includes:

applying a coating of p-diazo-2,5-diethoxy-1-(p-tolylmercapto) benzene borofluoride.

33. The method of claim 26 wherein said step of applying a first coating includes:

applying a coating containing a water soluble diazo resin.

34. The method of claim 26 wherein said step of applying a diazo borofluoride salt includes:

applying a coating having a minor amount of an organophilic hydrophobic water insoluble organic resin.

35. The method of claim 34 wherein:

said resin is polyvinylacetate.

36. The method of claim 34 wherein:

said minor amount is not more than 30% by weight.

37. The method of claim 26 wherein the step of applying a second coating includes:

applying a coating of a diazo-borofluoride salt in a solvent solution, the solvent being a non-solvent for the diazo resin.

* * * * *

UNITED STATES PATENT OFFICE
CERTIFICATE OF CORRECTION

PATENT NO. : 3,899,332

DATED : August 12, 1975

INVENTOR(S) : Richard T. Traskos

It is certified that error appears in the above-identified patent and that said Letters Patent are hereby corrected as shown below:

Column 2, line 63, change "self" to --shelf--

Column 5, line 55, change "plate" to --plates--

Column 8, line 50, change "4-p-diazo" to --4% p-diazo--

Signed and Sealed this

*fourth* Day of *November 1975*

[SEAL]

*Attest:*

RUTH C. MASON
*Attesting Officer*

C. MARSHALL DANN
*Commissioner of Patents and Trademarks*